US008665125B2

(12) United States Patent
Reinhold et al.

(10) Patent No.: US 8,665,125 B2
(45) Date of Patent: Mar. 4, 2014

(54) ELECTRONIC DEVICE AND METHOD FOR MEASURING DIFFERENTIAL NON-LINEARITY (DNL) OF AN SAR ADC

(75) Inventors: Michael Reinhold, Erlangen (DE); Martin Allinger, Herzogenaurach (DE); Frank Ohnhaeuser, Stein (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/569,310

(22) Filed: Aug. 8, 2012

(65) Prior Publication Data

US 2013/0044015 A1   Feb. 21, 2013

(30) Foreign Application Priority Data

Aug. 15, 2011   (DE) .................. 10 2011 110 115

(51) Int. Cl.
*H03M 1/10* (2006.01)
(52) U.S. Cl.
USPC ........... 341/120; 341/172; 341/135; 341/144; 341/140; 341/138
(58) Field of Classification Search
USPC .................................. 341/110–155
See application file for complete search history.

(56) References Cited

U.S. PATENT DOCUMENTS

| | | | |
|---|---|---|---|
| 4,451,821 A | 5/1984 | Domogalla | |
| 4,970,514 A | 11/1990 | Draxelmayr | |
| 5,012,241 A | 4/1991 | Kuttner | |
| 6,400,302 B1 * | 6/2002 | Amazeen et al. | 341/172 |
| 7,944,387 B2 * | 5/2011 | Ohnhaeuser et al. | 341/172 |
| 7,965,218 B2 * | 6/2011 | Ohnhaeuser et al. | 341/172 |
| 8,049,654 B2 * | 11/2011 | Reinhold et al. | 341/172 |

FOREIGN PATENT DOCUMENTS

EP   0696394   4/1994

OTHER PUBLICATIONS

DE Search Report mailed May 16, 2012.

* cited by examiner

*Primary Examiner* — Lam T Mai
(74) *Attorney, Agent, or Firm* — Alan A. R. Cooper; W. James Brady, III; Frederick J. Telecky, Jr.

(57) ABSTRACT

The device comprises a successive approximation register, a capacitive digital-to-analog converter comprising a plurality of capacitors, the plurality of capacitors being coupled with a first side to a common node; a comparator coupled to the common node and being adapted to make bit decisions by comparing a voltage at the common node with another voltage level, and a SAR control stage for providing a digital code representing a conversion result. The device is configured to operate in a calibration mode, where the device is configured to sample a reference voltage on a first capacitor of the plurality of capacitors by coupling one side of the first capacitor to the reference voltage, to perform a regular conversion cycle with at least those capacitors of the plurality of capacitors having lower significance than the first capacitor and to provide the conversion result of the regular conversion cycle for calibrating the first capacitor.

12 Claims, 3 Drawing Sheets

ELECTRONIC DEVICE AND METHOD FOR MEASURING DIFFERENTIAL NON-LINEARITY (DNL) OF AN SAR ADC

CROSS-REFERENCE TO RELATED APPLICATIONS

This application claims priority from German Patent Application No. 10 2011 110 115.6, filed Aug. 15, 2011, which is hereby incorporated by reference for all purposes.

TECHNICAL FIELD

The invention relates to an electronic device method for analog-to-digital conversion using successive approximation, and more specifically, to measuring the differential non-linearity (DNL) of a successive approximation register analog-to-digital converter (SAR ADC) and calibrating the SAR-ADC according to the measurement.

BACKGROUND

A typical successive approximation register (SAR) analog-to-digital converter (ADC) includes a capacitive array or capacitive digital-to-analog converter (CDAC) for performing a successive approximation of a sampled input signal. The CDAC includes a plurality of capacitors, each of which can be assigned to a bit of the digital output word of the SAR-ADC. The capacitors can be coupled on one side, which is referred to as common node. This common node can be coupled to an input of a comparator. During each conversion step, the comparator compares its input signals and provides a bit of a digital output word to a control stage (also referred to as successive approximation register SAR). The other side of the capacitors of the CDAC are then switched in accordance with the comparison result. The plurality of capacitors may be subdivided into two or more stages. The first stage may include capacitors relating to the most significant bits (MSBs) of the digital output word of the SAR-ADC. This stage is referred to as main-CDAC. The second stage may include the capacitors relating to the least significant bits (LSBs) of the digital output word of the SAR-ADC. This second stage is referred to as sub-CDAC. There may be a serial capacitor coupling the main-CDAC and the sub-CDAC for scaling the two stages for approximation steps relating to the MSBs and the LSBs, respectively. The absolute capacitance values in the two stages may be almost similar. However, in order to achieve high resolution and good linearity, the matching of the capacitance values is important.

With the typical matching constraints of capacitance values in a semiconductor (e.g. CMOS) technology, a resolution of the SAR-ADC of about 10 to 12 bit can be achieved. For higher resolution, the capacitors mismatch has to be adjusted. The digital output word of the SAR-ADC can be digitally corrected by adding or subtracting digital correction values in order to compensate static mismatch of the capacitance values. However, this approach is only applicable as long as the successive approximation process converges. Convergence means that at the end of the conversion procedure, a voltage difference at the comparator input is equal to or smaller than the value that corresponds to an LSB. Ideal convergence means that the voltage difference between the comparator inputs corresponds to a value that is smaller than $+/-\frac{1}{2}$ LSB. The capacitors relating to several of the LSBs (for example capacitors of the sub-CDAC) are usually not trimmed after production of the integrated circuit as they achieve sufficient matching by design measures. There are several different principles that can be applied for trimming the capacitors of the main-CDAC. One is based on laser trimming, where capacitor values are added or subtracted from the capacitor array by use of laser beam, which removes connections in a prior assembly step. Another principle is based on adding or subtracting capacitors to and from the capacitor array based on setting switches and storing the appropriate states of the switches in a memory. Both techniques may use self calibration procedures which aim to determine the amount of mismatch of the capacitors indicating the capacitance values which are to be added or subtracted from the capacitors of the main CDAC. However, both trimming or calibration procedures require a rather complex production step, which is time consuming and increases production costs.

U.S. Pat. No. 6,747,589 B2 discloses a dynamic error correction step for an SAR-ADC in order to increase speed and reduce current drive requirements of the SAR-ADCs. The basic idea consists in testing a bit decision as to whether the error remains below a maximum admissible limit. Testing and correction is performed quasi simultaneously by selectively coupling one or two additional correction capacitors of the same size as the capacitor of the tested bit. The two additional correction capacitors are switched between the reference voltages in order to add or subtract a charge value to the network, which is equivalent to a certain bit capacitor and the output of the comparator is used as an indicator of the error. The correction capacitors provide that the successive approximation process converges. However, the digital output word of the SAR-ADC is corrected by adding or subtracting single bits corresponding to the corrected position and the mismatch of the capacitance values of the capacitors is removed by trimming procedures as described above.

There are more and less significant bits in a digital output word of a SAR-ADC, and corresponding more or less significant capacitors in the CDAC. The significance of a capacitor is not strictly related to its capacitance value, but rather to its contribution to the voltage level on the comparator input (common node). This contribution can be considered as a difference voltage or voltage step $\Delta V$ on a node, typically on the common node. The more significant bits of a digital output word are determined earlier than less significant bits during the successive approximation process. Therefore, the capacitor(s) are also used in order of their significance starting with the most significant capacitor and ending with the least significant capacitor(s).

In an integrated semiconductor device, the maximum and the minimum physical size of a capacitor is limited. The upper limit is due to chip costs due to chip area and the lower limit due to technological boundaries, as minimum structure size and parasitic effects. Therefore, the minimum and maximum capacitance value of a capacitor should remain within reasonable limits.

SUMMARY

It is an object of the invention to provide a semiconductor device and a method for analog-to-digital conversion using successive approximation offering the possibility to measure DNL of an SAR-ADC to calibrate capacitors of a capacitive array (CDAC) used for the successive approximation in a manner being quicker and requiring less interference with the standard design of the analog-to-digital converters than according to the prior art.

In one aspect of the invention, there is an electronic device for analog-to-digital conversion of an analog input signal using successive approximation. The device comprises a successive approximation register, a capacitive digital-to-analog converter (CDAC) comprising a plurality of capacitors, wherein the plurality of capacitors is coupled with a first side to a common node. There is a comparator being coupled to the common node and being adapted to make bit decisions by comparing a voltage level at the common node with another voltage level. Furthermore, there is a successive approximation register control stage for providing a digital code representing a conversion result.

The electronic device may then be configured to switch from a normal conversion mode into a calibration mode. In the calibration mode, the electronic device is configured to sample a reference voltage on a first capacitor of the plurality of capacitors and to perform an analog-to-digital conversion cycle with at least those capacitors of the plurality of capacitors having lower significance than the first capacitor.

In an embodiment of the invention, the electronic device may be configured to decouple the analog input signal from the plurality of capacitors, to sample a reference voltage on at least a first capacitor of the plurality of capacitors, to decouple the first capacitor from the reference voltage after sampling, to perform a regular conversion cycle with at least those capacitors of the plurality of capacitors having lower significance than the first capacitor. The conversion result can then be used as a trimming value for calibrating the first capacitor.

The calibration mode may also be referred to as differential non-linearity (DNL) measurement mode as the mismatch of the capacitors to be trimmed or calibrated introduces a differential non-linearity into the analog-to-digital conversion. The plurality of capacitors having lower significance than the first capacitor is assumed not to need calibration. This can be due to sufficient matching or to previous calibration steps. According to this aspect of the invention, the weight of the first capacitor is compared with the weight of all capacitors having lower significance. The main advantages of this approach are that almost no significant additional hardware is required and that calibration can be performed much quicker than according to the prior art.

In an aspect of the invention, the electronic device for analog-to-digital conversion can be a hybrid analog-to-digital converter. This means that the analog-to-digital converter can be configured such that at least some of the bits (for example some of the most significant bits and/or some of the least significant bits) are determined by a mechanism different from a capacitive digital-to-analog converter (CDAC) using successive approximation.

The electronic device may comprise a first analog-to-digital conversion stage with a first plurality of capacitors and a second analog-to-digital conversion stage. One of the two stages or both stages may be configured to perform analog-to-digital conversion according to successive approximation. A control stage may be coupled to the first plurality of capacitors for connecting one capacitor to a first reference voltage level or a second reference voltage level in response to a conversion step performed by the second analog-to-digital conversion stage. The stage or stages may then be configured in accordance with the aspects and embodiments of the invention.

The second analog-to-digital conversion stage can be configured to use a different type of digital-to-analog conversion that can include, for example, a flash analog-to-digital conversion or a resistive digital-to-analog conversion. The aspects of the invention also apply to analog-to-digital converters which are configured to use analog-to-digital conversion in accordance with successive approximation only for some but not all bits of the digital output word of the analog-to-digital converter. The specific setting of the first capacitor may be controlled by digital logic. This digital logic can comprise flip-flops which can then be configured to operate as scan flip-flops.

In the calibration mode, the analog-to-digital conversion may be changed with respect to a normal analog-to-digital conversion cycle. The voltage level at the common node may then be reduced in order to force the first capacitor to not remain set during the conversion. According to this aspect of the invention, it is avoided that the analog-to-digital converter provides the trivial result that the first capacitor is set and all other capacitors are not set after a normal conversion cycle.

The calibration of the first capacitor may then be performed at a plurality of times. The result of each calibration cycle is the digital output signal of the analog-to-digital converter. The digital results of multiple calibration cycles may be summed up and averaged in order to increase the precision of the evaluation of the exact capacitance value of the first capacitor to values lower than 1 least significant bit (LSB). The averaged result may then be used for calibrating the first capacitor. There are various different ways of calibrating capacitors based on the averaged digital value which depends on the specific design and technology used for the analog-to-digital converter.

After having calibrated the first capacitor, a second capacitor can be calibrated. The second capacitor may be the next capacitor having higher significance than the first capacitor. If the first capacitor is, for example, the capacitor relating to MSB-5, the second capacitor to be measured and calibrated would then be the capacitor relating to MSB-4. The procedure continues with the capacitor relating to MSB-3 (third capacitor in this terminology) and so on up to the capacitor relating to the MSB.

In an aspect of the invention, any trimming values for calibrating the capacitors (first, second, etc.) may be determined in the electronic device. In an embodiment of the invention, the trimming values may also be determined externally to the electronic device.

In an embodiment of the invention, the successive approximation register (SAR) can be configurable to operate as a scan register for storing a bit pattern. This bit pattern may then indicate the capacitor to be calibrated. In the present context, the bit pattern may then indicate that the plurality of capacitors is switched so as to sample the reference voltage on the first capacitor. The further steps for evaluating the mismatch and calibrating the capacitor can be derived from the description above and herein below. In order to calibrate a second capacitor, a different bit pattern can be shifted into the SAR, selecting the second capacitor for calibration which results in the steps described for the first capacitor. The procedure is likewise performed for the third, fourth etc. capacitors.

In an aspect of the invention, the electronic device is configured to reduce the effect (i.e. to the common node/comparator input) of the charge sampled on the first capacitor after decoupling the first capacitor from the reference voltage. This aspect of the invention is based on the observation that an analog-to-digital converter, performing a regular conversion according to successive approximation and having sampled the reference voltage on one of the capacitors of its capacitor array, always returns the exact same value after a regular analog-to-digital conversion cycle, even if the respective capacitor (the first capacitor) fails to have the target capacitance value. If the effect (i.e. the effect to the common node) of the charge on the at least first capacitor is not reduced before performing the regular analog-to-digital conversion cycle, the at least first capacitor is only compared with itself and the result will always be that the at least first capacitor (the respective bit for the at least first capacitor) is always set.

Therefore, the effect of the sampled charge on the capacitor has to be lowered by a certain amount in order to receive useful information of the matching (mismatch) with respect to the other capacitors of the plurality of capacitors (CDAC).

In an embodiment of the invention, the voltage level on the common node due to the charge on the first capacitor may be changed by using a redundant capacitor. A redundant capacitor is a capacitor that is not necessary for the analog-to-digital conversion, in the ideal case. This means, for example, that the components match perfectly, no dynamic errors occur and no non-idealities or other side effects are present. In an embodiment, the redundant capacitor may be a dynamic error correction capacitor. The voltage level on the common node due to the charge on the first capacitor may then be changed by coupling the dynamic error correction capacitor with one side to a reference voltage. The dynamic error correction capacitor is then also coupled with one side to the common node and with the other side to the reference voltage. The dynamic error correction capacitor is originally provided for ensuring that the conversion cycle converges. However, according to this aspect of the invention, the dynamic error correction capacitor is coupled to a specific reference voltage level in order to change the voltage at the common node due to the charge sampled on the first capacitor by a certain amount. It is further assumed, that the dynamic error correction capacitor is either already calibrated or does not require calibration due to its size and/or design measures.

According to an aspect of the invention, a complete conversion cycle, starting with the capacitor having the highest significance down to the capacitor having the lowest significance, can be performed if a dynamic error correction capacitor is present and used in order to vary the voltage at the common node due to the charge sampled on the first capacitor.

In an aspect of the invention, the electronic device may be configured to perform a reference conversion. This reference conversion can be used for reducing, for example, an offset due to charge injection of switches. In this regard, the hold switches coupled to the inputs of the comparator can be considered a main source of charge injection. Accordingly, the electronic device is preferably configured to compensate an error due to the switching of the hold switches.

If the analog-to-digital converter comprises dynamic error correction capacitors, the reference conversion cycle can differ from the calibration conversion cycle only in that a dynamic error correction capacitor is switched to have an effect opposite to the effect in the calibration conversion cycle. If the results of the reference conversion cycle and the calibration conversion cycle are subtracted and twice the corresponding digital value of the dynamic error correction capacitances is added to the result, a digital value corresponding to the mismatch of the first capacitor is received.

In order to achieve the opposite effect during the reference conversion, the voltage level at the common node can be increased.

The reference conversion cycle and the calibration conversion cycle may be performed in an alternating manner. However, due to the high speed of the conversion in analog-to-digital converters, several reference conversion cycles and several calibration conversion cycles may be performed in separate bursts before the results are subtracted.

The invention also provides a method for analog-to-digital conversion of an analog input signal using an electronic device. The electronic device comprises a successive approximation register, a capacitive digital-to-analog converter comprising a plurality of capacitors, wherein the plurality of capacitors is coupled with the first side to a common node. Furthermore, a comparator is provided which has a first input coupled to the common node and is adapted to make a bit decision based on a voltage level at the common node. There is a successive approximation register control stage for providing a digital code representing a conversion result. The electronic device may then be switched into a calibration mode. The analog input signal may be decoupled from the plurality of capacitors. A first capacitor of the plurality of capacitors may then be coupled with one side to a reference voltage for sampling the reference voltage. The first capacitor may then be decoupled from the reference voltage after sampling. A regular conversion cycle may be performed with at least those capacitors of the plurality of capacitors having lower significance than the first capacitor. The conversion result of the conversion cycle can be used for calibrating the first capacitor.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF EMBODIMENTS

Figure 1:
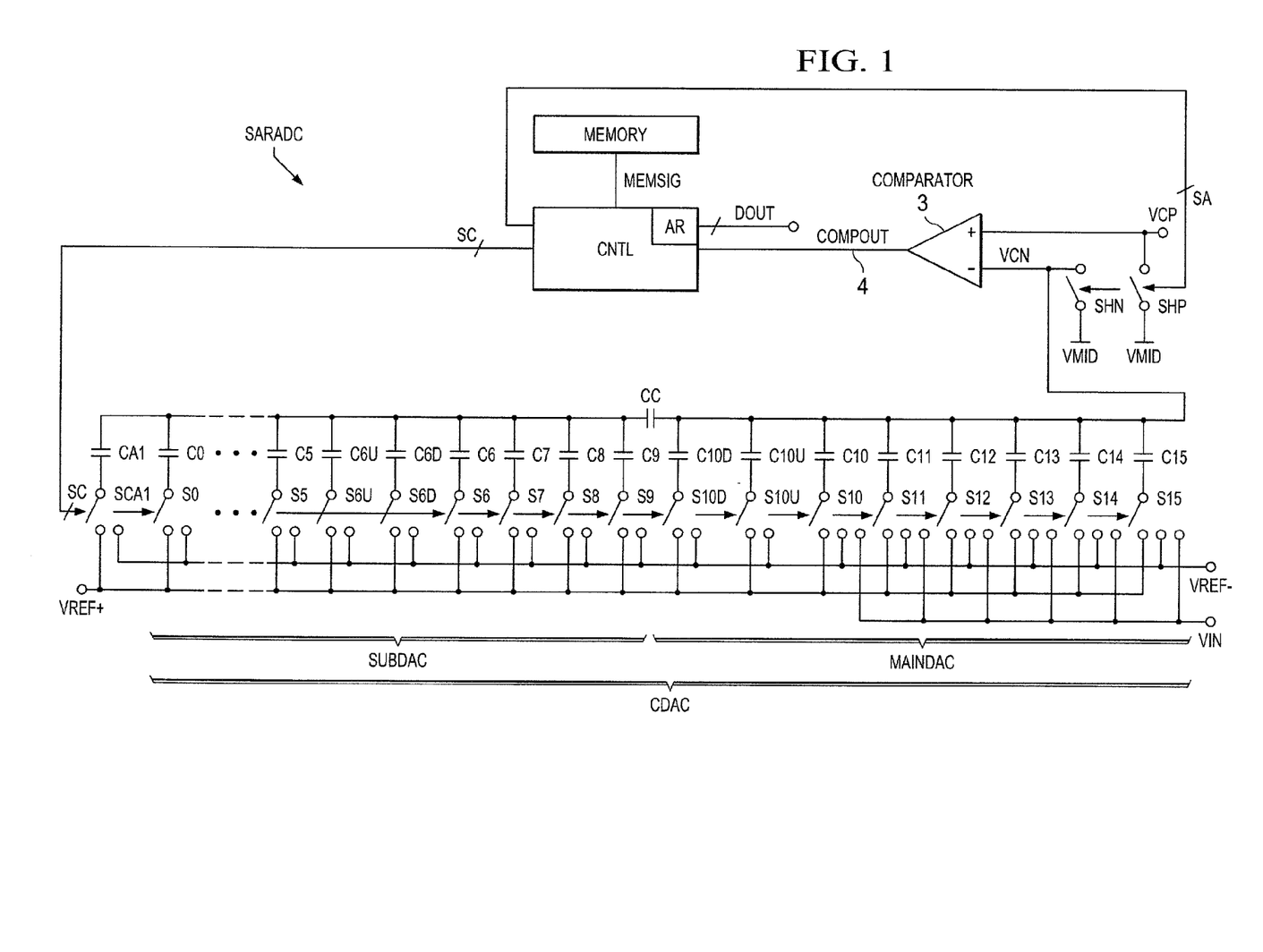
FIG. 1 shows a simplified circuit diagram of a preferred embodiment of the invention.

FIG. 1 shows a simplified circuit diagram of a preferred embodiment of the invention. A plurality of capacitors including capacitors C0 to C15 is divided into stages; a sub-CDAC SUBDAC and a main-CDAC MAINDAC. MAINDAC and SUBDAC are coupled by a coupling capacitor CC. The capacitor CC serves as scale-down capacitor between the two stages. The series of CC and the sum of the SUBDAC may have the same capacitance value than C10. The ideal value or significance of C10 may then be 1024 LSB. The weight or significance of the capacitors C0 . . . C9 of the SUBDAC (and the other capacitors arranged in the SUBDAC) may then be 1023 plus additional capacitors arranged in the SUBDAC (dynamic error correction capacitors C6U and C6D and auxiliary capacitor CA1). The MAINDAC includes the more significant capacitors C15 to C10 (capacitors associated with the six most significant bits MSB, MSB-1 to MSB-5). C15 has the greatest capacitance value and is the most significant capacitor (CMSB). C0 in SUBDAC has the smallest capacitance value and is the least significant capacitor (CLSB). Switches S0 to S15 are provided in order to connect one side of the capacitors of the CDAC to either a first reference voltage VREF+ or a second reference voltage VREF− or to an input voltage VIN. The switches are controlled through control signals SC which are provided by control stage CNTL according to a successive approximation scheme as known in the art. The comparator COMP has a negative input node VCN, which serves as the common node in accordance with aspects of the invention. The positive input of the comparator COMP is the node VCP. The output 4 of comparator COMP is coupled to the control stage CNTL. The control stage CNTL includes the successive approximation register and performs all necessary steps in accordance with the present invention and in accordance with analog-to-digital conversion according to successive approximation.

In this embodiment, capacitors C15 to C10 can be trimmed by a trimming network (not shown), or a similar means, including capacitors and switches. However, also smaller capacitors and in particular capacitors arranged in the SUB-DAC may be physically trimmed. In this embodiment of the invention, it is assumed that the capacitors of the SUBDAC (C0 to C9) do not need trimming. However, in other embodiments, this can be different and the calibration should then start with another capacitor.

After C10 is switched to either VREF+ or VREF− in accordance with an approximation step, the two capacitors C10U, C10D are switched to either the first reference voltage VREF+ or the second reference voltage VREF− in order to establish convergence of the entire conversion procedure. The conversion procedure starts with the most significant capacitor C15 in order to determine the MSB and switch S15 is set accordingly. The procedure continues in the order of the significance (i.e. in order of the charge/voltage contribution to the common node VCN) of the remaining capacitors, i.e. with capacitors C14, C13, C12, C11 and C10. The respective bits, i.e. the MSBs of the digital output word, are set accordingly. At the beginning of a conversion cycle, C10U is connected to VREF− and C10D to VREF+. During conversion step 6 the capacitor C10 is first switched to VREF+. If VCN<VCP, the comparator output is low and switch S10 connects to VREF+. If VCN>VCP, the comparator output is high and switch S10 changes back to VREF−. After the conversion step corresponding to C10, the error correction step using C10D and C10U is performed. If the comparator is low at the beginning of the error correction step, C10U is switched from VREF− to VREF+. When the comparator output remains low, C10U will be kept at VREF+. If the comparator changes to high, no correction is required and C10U will be switched back to VREF−. If the comparator output is high after step 10, nothing changes at the beginning of the error correction step. If the comparator remains high, C10D is switched from VREF+ to VREF−. If the comparator output turns low, no correction is required. After this correction step, the remaining steps 9 to 0 with capacitors C9 to C0 are performed.

The capacitance values of the capacitors C0 to C15 have to meet a specific condition. The combined effect of C0 to C9 on the voltage change at the comparator input must be equal or larger than the effect on the voltage change at the comparator input of C10 minus 1 LSB. 1 LSB corresponds to the effect of capacitor C0 in this embodiment. This can be written as

WEIGHT ($C0+C1+C2+C3+C4+C5+C6+C7+C8+C9$)>=WEIGHT ($C10-C0$)

with C0 to C10 being the capacitance values of the respective capacitors.

The error correction step with C10 provides that the remaining successive approximation process converges, but only if the condition is met. However, if the performance of the analog-to-digital converter can be less than 16 bit, it is possible to accept a greater mismatch, i.e. an error of, for example, 2 LSB or 4 LSB. If more than one error correction step is performed, convergence must be ensured at least insofar as the combination of all correction steps establishes convergence. According to the condition, it is required that even under worst case condition (i.e. maximum production spread, i.e. maximum mismatch) the sum of the capacitance values of all capacitors being associated with bits of a significance below the error correction position must be smaller than the capacitance value of the capacitor to which the error correction is applied minus the capacitance value of the capacitor associated with the least significant bit position. This condition can be set up for any capacitive array. In order to determine the position at which the error correction step should at least be performed (i.e. which capacitor should have the associated correction capacitors), the production spread or maximum expected mismatch of the capacitance values of the technology used for manufacturing the electronic device should be known. If the condition is not met, there will be a gap in the transfer function of the analog-to-digital converter that can not be closed by digital error correction only. The present invention equally applies to digital trimming and to physical trimming of capacitors of a capacitive array used for analog-to-digital conversion.

However, if convergence of the successive approximation process is established under all mismatch conditions, the mismatch of the capacitors can be determined in an initial calibration step and the mismatch can then be digitally compensated during the analog-to-digital conversion steps. The digital correction values which are necessary for compensating the static mismatch of the capacitors can be stored in a memory MEM, which may be a RAM, or ROM, as for example, an EEPROM. During analog-to-digital conversion, the control stage may then retrieve the correction values from the memory MEM through bus MEMSIG (including all necessary data and control signals) and add or subtract them from the conversion result, which is based on capacitors which do not match. Therefore, the digital correction values are different from correction values which may be used for dynamic error correction according to the prior art, as the correction values according to this aspect of the invention, include the mismatching capacitance values. The digital correction values represent a compensation of a static error instead or in addition to a dynamic error. Practically, the error correction values will then have more relevant bits then for the conventional dynamic error correction, where only a single bit at the error correction position is relevant. The bits of the digital correction values are particularly relevant in the most significant positions, i.e., for those capacitors (e.g. C15 to C10), which are conventionally physically trimmed. However, if physical trimming is not applied any more, the mismatch compensation is performed through digital correction by adding or subtracting digital correction values. The changes to the conventional analog-to-digital converters are only minor since an adder and a memory may already be present for conventional dynamic error correction.

A second error correction step may be performed with correction capacitors C6U, C6D, similar to the error correction step with C10U, C10D. The second error correction step may be performed after the approximation step relating to C6 and it may have its own contribution to convergence.

A fine tuning capacitor CA1 may be coupled to SUBDAC as an optional improvement of the SAR-ADC, according to the invention. The contribution in voltage change on the common node of the fine tuning capacitor may only be a fraction of the contribution of the capacitor corresponding to an LSB. The capacitance value of CA1 may then only be a fraction of the capacitance value of the smallest capacitor C0 of the CDAC. The capacitor CA1 is used as a fine tuning capacitor in order to provide additional accuracy of the SAR-ADC. In addition to the single fine tuning capacitor CAL more fine tuning capacitors may be provided, which will then entail further extension of the digital correction values. This can provide a further increase of the internal precision of the ADC. The digital output words DOUT may not be extended.

The aspects of the present invention do not only relate to physical trimming (calibration) of capacitors, but likewise, to digital compensation of mismatch under the above conditions.

The comparator COMP is set to a specific voltage by switching the input nodes VCN and VCP through hold switches SHN and SHP to a mid voltage VMID (VMID can be ground GND). This step is performed previous to a conversion cycle. The hold switches SHN and SHP inject a certain charge into nodes VCN and VCP when being disconnected. This amount of charge may correspond to several LSBs of the analog-to-digital converter. This error due to charge injection has to be considered during the calibration in accordance with the aspects and embodiments of the invention.

In order to simplify the description of the calibration procedure, the following table indicates the correspondence between capacitance values, bits of the digital output signal DOUT (digital output word) of the analog-to-digital converter and the respective weight or value of each bit. The hold switches SHN and SHP are controlled by a control signal SA that is issued by the control stage CNTL.

| C15 | C14 | C13 | C12 | C11 | C10 | C9 | C8 | C7 | C6 | C5 | C4 | C3 | C2 | C1 | C0 |
| BIT15 | BIT14 | BIT13 | BIT12 | BIT11 | BIT10 | BIT9 | BIT8 | BIT7 | BIT6 | BIT5 | BIT4 | BIT3 | BIT2 | BIT1 | BIT0 |
| --- | --- | --- | --- | --- | --- | --- | --- | --- | --- | --- | --- | --- | --- | --- | --- |
| 32768 | 16384 | 8192 | 4096 | 2048 | 1024 | 512 | 256 | 128 | 64 | 32 | 16 | 8 | 4 | 2 | 1 |

Figure 2:
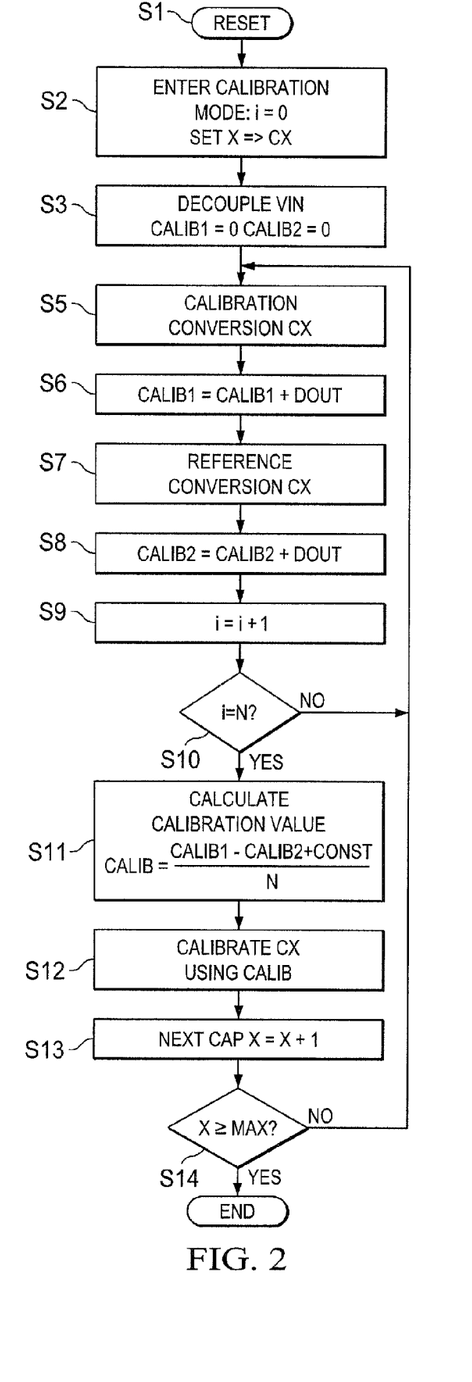
FIG. 2 is a simplified flow chart illustrating the calibration procedure according to aspects of the invention.

FIG. 2 shows a simplified flow chart of the calibration procedure, according to aspects of the invention. After reset (step S1), the calibration mode is entered in step S2. The parameter i is set to 0 and the parameter X indicates the respective capacitor to be calibrated. N is the number of conversion cycles. In this example, the capacitor to be calibrated is CX. In step S3, the input voltage VIN is decoupled from the plurality of capacitors CDAC.

The sum of digital outputs DOUT during calibration is stored in variables CALIB1 and CALIB2, which are set to 0 in step S3. In step S5, a calibration conversion cycle for capacitor CX is performed. This calibration cycle will be explained in more detail with respect to FIG. 3 and FIG. 5. In step S6, the digital output signal DOUT of the analog-to-digital converter after the calibration conversion cycle of step S5 is added to the calibration parameter CALIB1. In step S7, a reference conversion cycle for capacitor CX is performed. The procedure in the reference conversion cycle is explained in more detail with respect to FIG. 4 and FIG. 6. In step S8, the digital output signal DOUT of the analog-to-digital converter after the reference conversion cycle is added to calibration parameter CALIB2. In step S9, the parameter i is increased by 1. Parameter i is then compared with parameter N, which indicates the maximum number of cycles for calibration. In step S10, it is decided whether this maximum number N of cycles is reached. If i=N, the calibration loop, including steps S5 to S10, is left and the calibration value CALIB is calculated in step S11. This calculation usually includes subtracting the calibration value CALIB2 of the reference conversion cycles from the calibration value CALIB1 of the calibration conversion cycles. The respective values have to be divided by the number of cycles N. A specific constant CONST may be added, if dynamic error correction capacitors are used. In step S12, the capacitor CX may then be calibrated based on the value CALIB. In step S13, the next capacitor (next capacitor CX+1) is selected by increasing the parameter X by 1. In step S14, it is decided whether the respective capacitor for the MSB (MAX, in this embodiment MAX=15) is reached. If X=MAX the calibration procedure is completed and the calibration mode (or DNL measuring mode) is left. If the parameter X is equal to or lower than MAX, the next calibration cycle is started with another capacitor.

The calibration is started with the capacitor having the lowest significance of the capacitors that need calibration.

Figure 3:
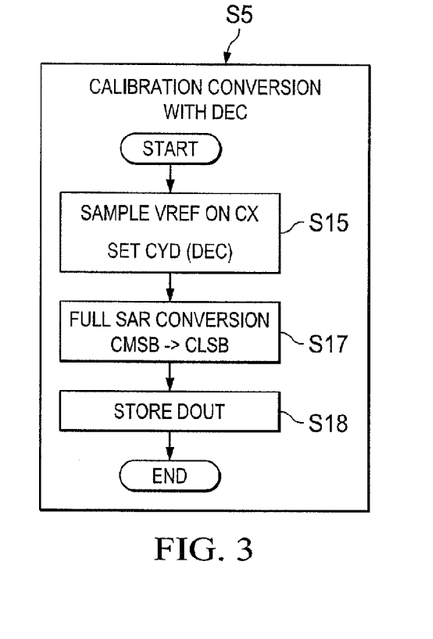
FIG. 3 is a simplified flow chart relating to a calibration conversion using dynamic error correction capacitors in accordance with aspects of the invention.

FIG. 3 shows a simplified flow chart of a calibration conversion cycle in an analog-to-digital converter having dynamic error correction capacitors. In step S15, the reference voltage VREF+ is sampled on capacitor CX. The dynamic error correction capacitor CYD is also coupled to VREF+. CYU is coupled to VREF−. After being coupled to VREF+ and VREF−, capacitors CYD and CYU remain in the respective positions. During conversion, CYD may be used to provide a negative voltage step at the comparator input (i.e. the common node) and CYU can be used to apply a positive voltage step at the comparator input. In order to reduce the voltage at the common node CYU has to be coupled to VREF+ (sample the positive reference voltage) and can then be switched to VREF− after sampling (i.e. after the hold switches SHN, SHP are disconnected). During the subsequent regular conversion cycle, the capacitors CYD and CYU can be used in accordance with the normal dynamic error correction. In step S17 a full analog-to-digital conversion according to successive approximation is performed. In other words, all capacitors from CMSB to CLSB (from the capacitor having the highest significance to the capacitor having the lowest significance) are coupled to either VREF− or VERF+ in accordance with the standard successive approximation scheme. The output signal DOUT of the analog-to-digital converter is then stored, or, in other words contained in the successive approximation register SAR. In step S6, the digital output value DOUT is added to the calibration variable CALIB 1 as shown in FIG. 2.

Figure 4:
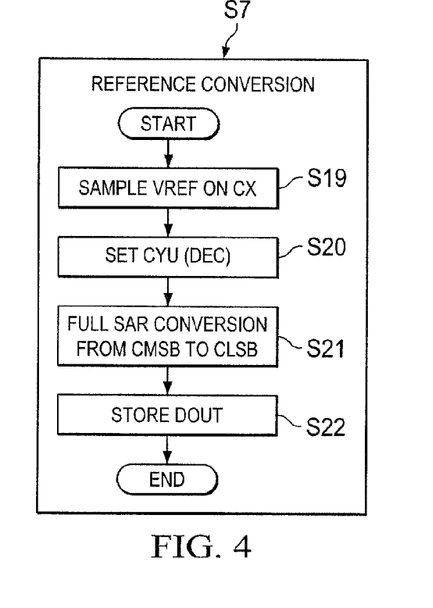
FIG. 4 shows a simplified flow chart relating to a reference conversion cycle using dynamic error correction capacitors in accordance with aspects of the invention.

FIG. 4 shows a simplified flow chart of a reference conversion cycle of step S7 shown in FIG. 2. During this conversion cycle, it is important that CX (the corresponding bit for CX) is set. Accordingly, a reference voltage VREF is sampled on capacitor CX. The dynamic error correction capacitor CYU should now sample VREF− and switch to VREF+ after sampling (after the hold switches are opened=disconnected), CYD should be connected to VREF+. The setting of the dynamic error correction capacitor in step S20 is opposite to the setting of the dynamic error correction capacitor in step S16 shown in FIG. 3 in terms of its effect to the voltage variation on the common node. In step S21, a full successive approximation analog-to-digital conversion is performed with the analog-to-digital converter. In step S22 the output signal DOUT is provided, which is then added to calibration parameter CALIB2 as shown in step S8 of FIG. 2. During the reference conversion cycle, the capacitor CX (its respective bit) should remain set. This means that the capacitor CX remains coupled to the reference voltage.

The procedure shown in the flow charts of FIG. 2, FIG. 3 and FIG. 4 overcome several problems relating to the self-calibration (measuring of mismatch) in accordance with aspects of the invention. Using the procedure according to the invention and in accordance with FIG. 2 to FIG. 4 removes the offset of the hold switches SHN and SHP and reduces the effect (i.e. the voltage level of the common node) of the charge sampled by the first capacitor CX by a small amount thereby rendering the information of the matching of the respective capacitor CX useful for calibration.

According to an illustrative example, the electronic device according to the invention may comprise a 16-bit analog-to-digital converter. The analog-to-digital converter may then sample the reference voltage VREF+ on capacitor C10 (X=10). The corresponding bit value is then 1024 (BIT10=1024). The bit pattern of DOUT would then be 0000 0100 0000 0000. In order to reduce the voltage at the common node VCN due to the charge sampled on C10, the error correction capacitor C6D and C6U are coupled to the reference voltage levels VREF+ and VREF− similar to the manner described above for capacitors CYD and CYU. The bit value of C6D is equal to C6 which is 64. Capacitors C6D, D6U and C6 have capacitance values and a significance that is so small that no calibration or trimming is needed for these capacitors in order to achieve sufficient precision. This means that the corresponding bit pattern of the ideal output word DOUT would be 0000 0011 1100 0000. Therefore, a value of BIT10+BITC6D is sampled which corresponds to 960 (1024−64=960). The value 1024 for BIT10 is the ideal value. The value may also be 1028 or any other value deviating from the ideal value 1024. However, for the following description it is assumed that the value is 1024. In the reference conversion cycle, the error correction capacitor is coupled so as to contribute a voltage change on the common node VCN which is opposite to the voltage change in the calibration conversion cycle. In the embodiment shown in FIG. 1, this means that C6U is coupled to reference voltage level VREF+. Without any mismatch, the result of the conversion would be 1088 (1024+64=1088). The offset of the hold switches SHN and SHP is contained in both conversion cycles, i.e. in the calibration conversion cycle and in the reference conversion cycle. This means, that the result of the calibration conversion cycle contained in the digital output word DOUT is CALIB1=BIT10−64+OFFSET. The result of the reference conversion cycle contained in the digital output of the digital output DOUT of the analog-to-digital converter is CALIB2=1024+64+OFFSET. The mismatch of capacitor C10 can then be calculated as

CALIB1−CALIB2+2·64=(BIT10−64+OFFSET)−(1024+64+OFFSET)+2·64=BIT10−1024.

The value 1024 is the target value for capacitor C10. The difference between the real value BIT10 (including mismatch) and the ideal value 1024 (may be different) indicates the mismatch.

This procedure can be repeated for all capacitors C11 to C15 having a higher significance than C10. The corresponding values in the above formula can be derived from the above table.

Figure 5:
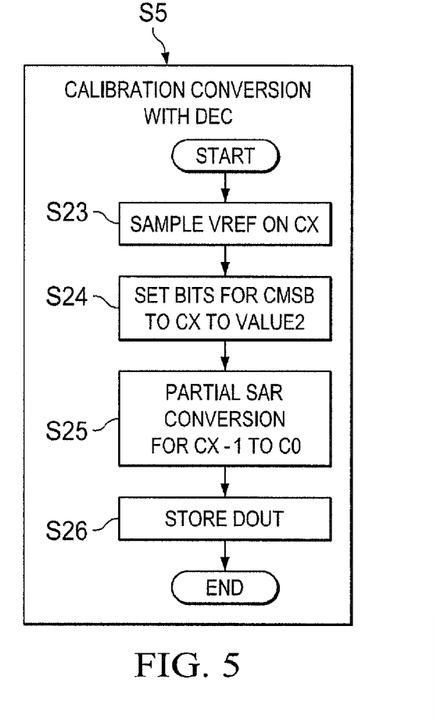
FIG. 5 shows a simplified flow chart of a calibration conversion cycle without dynamic error correction capacitors in accordance with aspects of the invention.

FIG. 5 shows a simplified flow chart of a calibration conversion cycle without dynamic error correction. This procedure can be useful if no dynamic error correction capacitors are available in an analog-to-digital converter. The dynamic error correction capacitors provide redundancy for the analog-to-digital conversion procedure. This kind of redundancy can also be provided by different mechanisms that can also be used for the aspects of the invention. In step S23, the reference voltage is sampled on the capacitor CX. In step S24, the respective setting for capacitor CX and all capacitors having higher significance is made. In this embodiment, bits BIT15 to BIT10 (CMSB to CX) are set to 0 (VALUE2). In step S25, a partial successive approximation analog-to-digital conversion cycle is performed with the analog-to-digital converter. This partial conversion cycle is only performed with capacitors having lower significance than capacitor CX. This means that capacitors CX−1 to C0 (C9 to C0) are switched to the respective reference voltages. In step S26, the result of the conversion is provided as digital output signal DOUT. DOUT is then added to CALIB1 as previously described and shown in FIG. 2.

Figure 6:
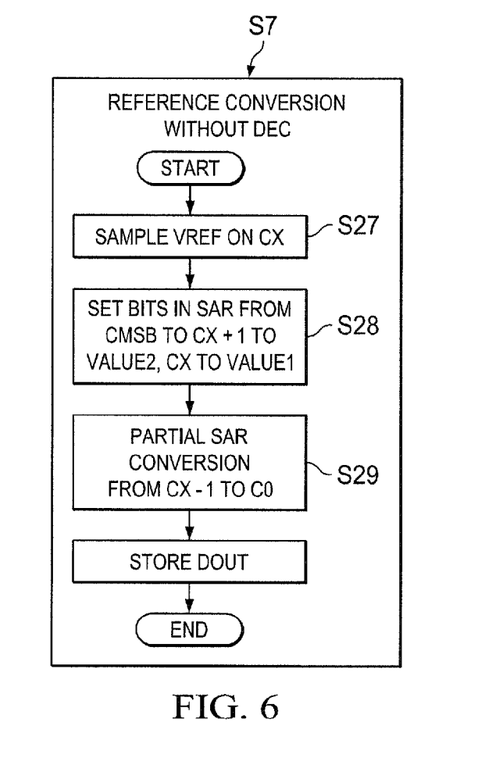
FIG. 6 shows a simplified flow chart of a reference conversion cycle without dynamic error correction capacitors in accordance with aspects of the invention.

FIG. 6 shows a simplified flow chart of a reference conversion cycle without dynamic error correction capacitors. The reference voltage VREF is sampled on capacitor CX in step S27. In step S28, the respective bits of capacitors CMSB to CX+1 are set to VALUE2. VALUE2 is 0 in this example. The bit for capacitor CX (BITx) is set to VALUE1, which is 1 in this example. In step S29, a partial conversion cycle is performed with capacitors having a lower significance than CX. These are capacitors C9 to C0. The output value of the conversion cycle is then contained in the output signal DOUT of the analog-to-digital converter and further processed as shown in FIG. 2.

In an illustrative example for the procedures shown in FIG. 5 and FIG. 6, the following settings can be used:

| BIT15 | BIT14 | BIT13 | BIT12 | BIT11 | BIT10 | BIT9 | BIT8 | BIT7 | BIT6 | BIT5 | BIT4 | BIT3 | BIT2 | BIT1 | BIT0 |
|---|---|---|---|---|---|---|---|---|---|---|---|---|---|---|---|
| 0 | 0 | 0 | 0 | 0 | 0 | x | x | x | x | x | x | x | x | x | x |
| 0 | 0 | 0 | 0 | 0 | 1 | x | x | x | x | x | x | x | x | x | x |

The value of the first conversion is then CALIB1=BIT10+OFFSET. The result of the second conversion is CALIB2=1024+OFFSET. The mismatch of C10 may then be calculated as:

CALIB1−CALIB2=(BIT10+OFFSET)−(1024+OFFSET)=BIT10−1024, with CONST=0. This result corresponds to the result received with the procedures shown in FIG. 3 and FIG. 4. However, it is not necessary to add a constant offset CONST in step S11 shown in FIG. 2. The disadvantage of the second embodiment of the invention is that it requires changing the standard conversion procedure to the analog-to-digital converter as only the lower significant capacitors of the analog-to digital converter are used in the conversion cycle.

If the respective reference conversion cycles and calibration conversion cycles are repeated several times, the resolution of the calibration value CALIB can be increased (uncorrelated noise is suppressed by averaging). If the number of repetitions is N=100, an accuracy of about 0.1 LSB can be achieved assuming that the noise is about 1 LSB. The analog-to-digital converter according to the invention may for example be configured to provide 1 MSPS (mega sample per second). For this analog-to-digital conversion rate, it takes only about 200 μs (=2·100·1 μs) (plus some overhead for writing the preset pattern to the SAR-ADC) to measure the size of the respective capacitor to be calibrated. The electronic device may be adapted only by adding a register bit for activating the calibration mode, in which a specific bit pattern is scanned into the successive approximation register. If for example flip flops are used for the successive approximation register (SAR). These flip flops may be changed into scan flip flops, which can be implemented by coupling multiplexers to the flip flops of the SAR. If a bit pattern is loaded the flip flops are connected in a chain. A simple control bit or an external pin of the electronic device may then be used to activate the differential non linearity measurement function.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An electronic device for analog-to-digital conversion of an analog input signal, the device comprising: a successive approximation register (SAR), a capacitive analog-to-digital converter (CDAC) comprising a plurality of capacitors coupled with a first side to a common node, a comparator coupled to the common node and being adapted to make bit decisions by comparing a voltage level at the common node with another voltage level, and a successive approximation register (SAR) control stage for providing a digital code representing a conversion result, wherein the electronic device is configured to operate in a calibration mode, in which the electronic device is configured to sample a reference voltage on a first capacitor of the plurality of capacitors and to perform a conversion cycle with at least those capacitors of the plurality of capacitors having lower significance than the first capacitor.

2. The electronic device according to claim 1, wherein the electronic device for analog-to-digital conversion is a hybrid analog-to-digital converter, in which at least some of the most significant bits or some of the least significant bits are determined by a mechanism different from a capacitive digital-to-analog converter (CDAC) using successive approximation.

3. The electronic device according to claim 1, wherein, in a calibration mode, the analog-to-digital conversion is adapted such that the voltage level at the common node is changed after sampling of the reference voltage on the first capacitor and before the conversion cycle is started with at least those capacitors of the plurality of capacitors having lower significance in order to force the first capacitor to remain not set during the conversion cycle.

4. The electronic device according to claim 1, being further configured to perform the calibration a plurality of times and averaging the results before calibrating the first capacitor.

5. The electronic device according to claim 1, wherein the successive approximation register is configurable to operate as a scan register for storing a bit pattern indicating the capacitor to be calibrated and to be coupled to the reference voltage in the calibration mode.

6. The electronic device according to claim 1, being further configured to reduce a voltage level at the common node due to a charge contributed by the first capacitor after decoupling the at least one capacitor from the reference voltage.

7. The electronic device according to claim 6, wherein the voltage level on the common node due to the charge on the first capacitor is reduced by coupling a redundant capacitor, in particular a dynamic error correction capacitor.

8. The electronic device according to claim 7, being further configured to perform a reference conversion to serve as a reference for the conversion of a calibration cycle, wherein, during the reference conversion, a setting of the first capacitor is opposite to the setting of the first capacitor during the calibration cycle.

9. The electronic device according to claim 8, wherein the bit corresponding to the first capacitor is forced to have the opposite setting during a reference conversion cycle by increasing the voltage level at the common node.

10. The electronic device according to claim 9, wherein the setting of the first capacitor during the reference conversion is made by using a redundant capacitor, in particular a dynamic error correction step.

11. The electronic device according to claim 10, wherein a calculation of a trimming value for calibrating the at least first capacitor is performed inside the electronic device.

12. A method for analog-to-digital conversion of an analog input signal using an electronic device comprising:
a successive approximation register (SAR);
a capacitive digital-to-analog converter (CDAC) comprising a plurality of capacitors;
the plurality of capacitors being coupled with a first side to a common node;
a comparator coupled to the common node and being adapted to make bit decisions by comparing a voltage level at the common node with another voltage level; and
a successive approximation register (SAR) control stage for providing a digital code representing a conversion result, the method comprising the steps of:
switching into a calibration mode;
decoupling the analog input signal from the plurality of capacitors;
coupling a first capacitor of the plurality of capacitors with one side to a reference voltage for sampling the reference voltage;
decoupling the first capacitor from the reference voltage after sampling;
performing a regular conversion cycle with at least those capacitors of the plurality of capacitors having lower significance than the first capacitor; and
using a conversion result of the conversion cycle for calibrating the first capacitor.

* * * * *